United States Patent
Hitomi et al.

(10) Patent No.: US 6,925,290 B2
(45) Date of Patent: Aug. 2, 2005

(54) RADIO RECEIVER

(75) Inventors: Akihiko Hitomi, Osaka (JP); Akio Inoue, Nara (JP); Yoshikazu Otsubo, Hirakata (JP); Takayuki Hamabata, Nara (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 800 days.

(21) Appl. No.: 09/995,586

(22) Filed: Nov. 29, 2001

(65) Prior Publication Data

US 2002/0068538 A1 Jun. 6, 2002

(30) Foreign Application Priority Data

Dec. 1, 2000 (JP) ........................................ 2000-367622

(51) Int. Cl.$^7$ ................................................ H04B 1/18
(52) U.S. Cl. .............................. 455/186.1; 455/160.1; 455/161.1; 455/182.3; 455/185.1
(58) Field of Search ........................... 455/181.1, 189.1, 455/184.1, 185.1, 186.1, 186.2

(56) References Cited

U.S. PATENT DOCUMENTS

| | | | |
|---|---|---|---|
| 4,403,344 A | 9/1983 | Yamada et al. ............. 455/181 |
| 5,317,403 A | * 5/1994 | Keenan ........................ 725/38 |
| 5,323,240 A | 6/1994 | Amano et al. .............. 348/731 |
| 5,734,444 A | * 3/1998 | Yoshinobu .................... 725/14 |
| 6,490,724 B1 | * 12/2002 | Ha et al. ......................... 725/9 |

FOREIGN PATENT DOCUMENTS

WO    WO 00/16549    3/2000

* cited by examiner

Primary Examiner—Binh Tieu
Assistant Examiner—Tuan Pham
(74) Attorney, Agent, or Firm—Armstrong, Kratz, Quintos, Hanson & Brooks, LLP

(57) ABSTRACT

A radio receiver embodying the present invention comprises, a front-end circuit for selecting a broadcasting wave of a certain frequency from broadcasting waves received, a memory for storing a channel registering table, tuning key, and a control circuit. A channel registering table has a plurality of channels registered therein, and a frequency and register time for each channel are written thereon. The control circuit specifies a channel of which register time is closest to time of the depression of the key out of a plurality of channels registered in the table upon the depression of the key to command tuning operation of the channel to the front-end circuit. Thus, the radio receiver can be realized wherein the device body is compact, and even when a listener does not remember a channel registered, a desired channel can be tuned in with easy manipulation for a short period of time.

5 Claims, 5 Drawing Sheets

FIG.2

|   | FREQUENCY | REGISTER TIME |
|---|---|---|
| 1 | 80.2MHz | 08 : 00 |
| 2 | 85.1MHz | 12 : 20 |
| 3 | 88.1MHz | 07 : 00 |
| 4 | 85.1MHz | 15 : 15 |
| 5 | 77.1MHz | 14 : 45 |
| 6 | 86.4MHz | 16 : 00 |
| 7 | — | — |
| ⋮ | ⋮ | ⋮ |
| N | — | — |

RADIO RECEIVER

FIELD OF THE INVENTION

The present invention relates to radio receivers capable of tuning in to one of a plurality of desired channels pre-registered with easy manipulation.

BACKGROUND OF THE INVENTION

With conventional radio receivers, when a listener is to tune in to a desired channel, the listener is required to perform manipulation for setting a received frequency to the frequency of the desired channel, entailing the problem of the cumbersome manipulation.

Already known are radio receivers which has a preset function for tuning in, with easy manipulation, to a channel out of a plurality of desired channels preset by a listener in advance.

Already known as a radio receiver having a preset function are a radio receiver provided with a plurality of preset keys and a radio receiver provided with a preset-up-key and a preset-down-key. In a radio receiver provided with a plurality of preset keys, a channel is registered for each preset key in advance. When a desired channel is to be tuned in, a preset key for the desired channel is manipulated to tune in to the channel with ease. On the other hand, in a radio receiver provided with a preset-up-key and a preset-down-key, these keys are manipulated repeatedly to set a channel forward until a received channel is changed over to an intended channel, whereby the desired channel can be tuned in with ease.

However, with the radio receiver having a plurality of preset keys, a device body is required to be provided with preset keys. This causes a higher cost and may make the device body greater in size. Further, in the case where the listener does not remember a channel registered for each preset key, the listener cannot tune in to a desired channel with one manipulation of one preset key. In this case the listener is required to manipulate a plurality of preset keys consecutively until the desired channel is tuned in, hence entailing the problem of cumbersome procedure and taking much time until the desired channel is tuned in.

Furthermore, with the radio receiver provided with a preset-up-key and a preset-down-key, the listener is required to repeat key-manipulation until the received channel is changed over to the intended channel, hence giving rise of the problem of cumbersome procedure and taking much time until the intended channel is tuned in.

SUMMARY OF THE INVENTION

An object of the present invention is to provide a radio receiver having a compact device body and capable of tuning in to a desired channel with easy manipulation for a short period of time even when a listener does not remember a channel registered.

The present invention provides a radio receiver which comprises:
  channel memory means for pre-registering a plurality of desired channels,
  a channel register key for performing manipulation of registering a desired channel in the channel memory means,
  time detection means for detecting current time,
  information processing means for registering in the channel memory means a frequency of a channel in tuned and registering time detected by the time detection means as register time upon the channel register key being manipulated, when the channel register key is manipulated with the channel tuned in,
  easy tuning key for performing manipulation of tuning in to a desired channel, and
  tuning control means for comparing time of key manipulation detected by the time detection means immediately when the easy tuning key is manipulated with register time of each channel registered in the channel memory means, and specifying a channel of which register time is closest to the time of the key manipulation out of one or a plurality of channels registered in the channel memory means, and commanding tuning operation of the channel.

With the radio receiver of the present invention, when one channel is tuned in, the channel register key is manipulated to register in the channel memory means a frequency of the channel in tuned and the time when the key is manipulated. A listener, therefore, manipulates the channel register key when a desired channel is tuned in to register the desired channel. Accordingly, the listener can pre-register one or a plurality of desired channels.

The listener thereafter manipulates the easy tuning key to tune in to one desired channel, tuning in to a channel registered in the channel memory means at time which is closest to the time of the key manipulation out of one or a plurality of channels registered in the channel memory means. The listener will listen to a program broadcasted by the same channel during the same hours in a day, for example, during commuting hours. Accordingly, the easy tuning key is manipulated, as described above, to cause the channel desired by the listener at that time to be tuned in.

With the radio receiver described above, the easy tuning key is only disposed on the device body serving as a manipulation key capable of tuning in to one channel out of a plurality of channels pre-registered, so that the device body is made compact.

Further, the easy tuning key is manipulated just one time to tune automatically in to a channel to which the listener will desire to listen at that time, i.e., the channel registered at the time which is closest to the time of the key manipulation out of a plurality of channels pre-registered, so that even if the listener does not remember the channel pre-registered, the listener can tune into the desired channel with easy manipulation for a short period of time.

Stated specifically, the information processing means comprises:
  register checking means for checking whether when the channel register key is manipulated with a channel tuned in, a channel of which a frequency is same as a frequency of the channel tuned in is registered in the channel memory means,
  first register processing means for registering in the channel memory means a frequency of a channel tuned in and registering time as register time detected by the time detection means upon the channel register key being manipulated, in the case where a channel of which a frequency is same as a frequency of the channel tuned in is not registered in the channel memory means.
  time difference checking means for comparing the register time of the channel of the same frequency with time detected by the time detection means upon the channel register key being manipulated, and checking whether time difference between the register time and the time detected is not greater than a predetermined value, in the case where a channel of which a frequency is same as a frequency of the channel tuned in is registered in the channel memory means, and second register processing means for registering in the channel memory means the frequency of the channel tuned in and registering in the channel memory means the time as register time detected by the time detection means upon the channel register key being manipulated, in the case where the time difference between the register time and the time detected is greater than the predetermined value.

According to the specific construction, in the case where the channel of which a frequency is same as a frequency of the channel tuned in is not registered in the channel memory means upon the channel register key being manipulated, the frequency of the channel tuned in and the time when the channel register key is manipulated are registered in the channel memory means. On the other hand, in the case where the channel of which a frequency is same as a frequency of the channel tuned in is registered in the channel memory means, only when the time difference between the register time of the channel of the same frequency and the time when the channel register key is manipulated is greater than the predetermined value, the frequency of the channel tuned in and the time described are registered in the channel memory means. Thus, channels having same frequencies are not registered for same hours in a day, and memory region of the channel memory means can be used effectively.

Stated specifically, the information processing means further comprises information update means for updating the register time of the channel of which a frequency is same as a frequency of the channel tuned in to the time detected by the time detection means upon the channel registering key being manipulated, in the case where the time difference between the two times mentioned above is not greater than the predetermined value according to the time difference checking means.

With the specific construction, when the channel register key is manipulated, the channel of which a frequency is same as a frequency of the channel tuned in has been registered in the channel memory means, in the case where the time difference between the register time of the channel of the same frequency and the time when the channel register key is manipulated is not greater than the predetermined value, the register time is updated to the time when the channel register key is manipulated. Thereafter, when a channel tuned is specified, the updated register time is compared with the time of the key manipulation when the easy tuning key is manipulated, as stated above.

Further stated specifically, the tuning control means comprises:

order recognition means for recognizing order of the register time being close to time of the first manipulation of an easy tuning key with a plurality of channels registered in the channel memory means corresponding to the first manipulation of the key, tuning command means for specifying a channel of which register time is closest to the time of the first key manipulation out of a plurality of channels registered in the channel memory means based on the order recognized by the order recognition means corresponding to the first manipulation of the easy tuning key, and commanding tuning operation of the channel, and channel change-over control means for specifying a channel of which register time is closest in the next place of the channel tuned in to the time of the first key manipulation out of a plurality of channels registered in the channel memory means based on the order recognized by the order recognition means corresponding to the second and later manipulation of the easy tuning key.

According to the specific construction, the first manipulation of the easy tuning key is performed, to tune in to the channel of which the register time is closest to the time of the first manipulation out of a plurality of channels registered in the channel memory means. In this state the easy tuning key is manipulated again, to tune in to the channel of which register time is second closest to the time of the first key manipulation. The easy tuning key is manipulated further again, to tune in to the channel of which the register time is third closest to the time of the first key manipulation. Accordingly, every time the easy tuning key is manipulated, a received channel is changed over in order of register time being close to the time of the first key manipulation out of the plurality of pre-registered channels.

With the radio receivers having the construction described, even if a channel tuned in corresponding to the first manipulation of the easy tuning key is not a desired channel, further manipulation of the easy tuning key changes over a received channel to tune in to the desired channel. In this procedure, even if a channel tuned in corresponding to the first manipulation of the easy tuning key is not a desired channel, the register time of the desired channel will be close to the time of the key manipulation. Therefore, as described above, the received channel is changed over in order of the register time being close to the time of the first key manipulation with the plurality of pre-registered channels, with the result that the desired channel can be tuned in with less times of the manipulation.

Further stated specifically, the channel change-over control means comprises:

channel specifying means for specifying a channel of which register time is closest in the next place of the channel tuned in to the time of the first key manipulation out of the plurality of channels registered in the channel memory means corresponding to the second and later manipulation of the easy tuning key, or to channel specifying command based on the order recognized by the order recognition means, checking means for checking whether a channel is registered in the channel memory means, which has a same frequency as the specified channel and of which register time is closer to the time of the first key manipulation than the specified channel, change-over command means for commanding tuning change-over operation for changing-over a received channel to the specified channel in the case where said channel is not registered, and channel specifying command means for giving the channel specifying command to the channel specifying means in the case where the channel is registered.

According to the specific construction, in the case where the channel of the same frequency as the specified channel has not been tuned in after the first manipulation of the easy tuning key, the specified channel is tuned in. On the other hand, in the case where the channel of the same frequency as the specified channel has already been tuned in after the first manipulation of the easy tuning key, the specified channel is not tuned in, to specify a channel of which a register time is next close to the time of the first key manipulation.

With the radio receiver having the specific construction described, when the received channel is changed over corresponding to the manipulation of the easy tuning key, a channel having a same frequency as the channel once tuned in is skipped, so that the channel having the same frequency will never be tuned in two or more times. Accordingly, in the case where a channel tuned in when the first manipulation of the easy tuning key is performed is not the desired channel, the desired channel can be tuned in with less operation times, and for a shorter period of time.

As described above, the radio receiver of the present invention makes it possible to compact the device body, and even if the listener does not remember the pre-registered channel, the desired channel can be tuned in with easy manipulation for a shorter period of time.

BRIEF DESCRIPTION OF THE DRAWINGS

FIG. 2 is a diagram showing a channel registering table stored in the memory of the invention;

DETAILED DESCRIPTION OF EMBODIMENT

An embodiment of the invention will be described below in detail with reference to drawings.

Figure 1:
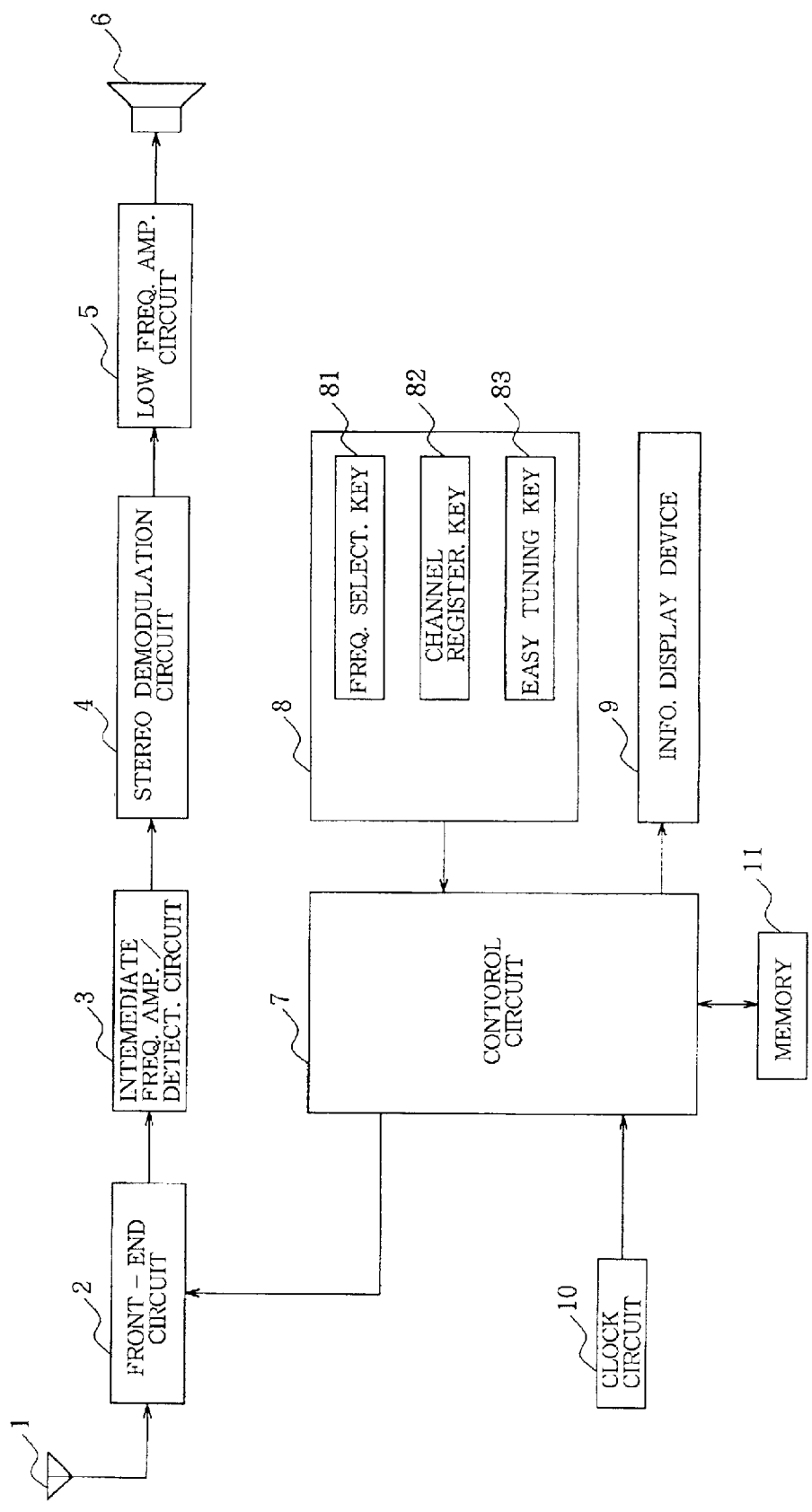
FIG. 1 is a block diagram showing the construction of the radio receiver embodying the invention.

With the radio receiver of the invention, radio broadcasting waves received by an antenna 1 are fed to a front-end circuit 2 having a PLL circuit, as shown in FIG. 1. With the circuit 2, a broadcasting wave of a certain frequency is selected from the radio broadcasting waves to convert the broadcasting wave into a signal of an intermediate frequency. A signal output from the front-end circuit 2 is input to an intermediate-frequency amplification/detection circuit 3. The signal is amplified and detected in the circuit 3, and thus obtained signal is input to a stereo demodulation circuit 4 to be stereo-demodulated. The signal output from the stereo demodulation circuit 4 is input to a low frequency amplification circuit 5 to be amplified, and thereafter fed to a speaker 6. As a result, radio broadcasting voice is output to the outside.

Connected to the front-end circuit 2 is a control circuit 7 having a microcomputer. The front-end circuit 2 is controlled in operation by the control circuit 7. Connected to the control circuit 7 are a key input device 8 and an information display device 9. The manipulation of the key input device 8 makes it possible to tune into a desired channel. The key input device 8 is provided with a frequency selection key 81 to be manipulated in setting a received frequency to the frequency of the desired channel, a channel register key 82 to be manipulated on registering one desired channel, and an easy tuning key 83 to be manipulated on tuning in to one desired channel. Shown on the information display device 9 are a received frequency and an error message stated below. Further, connected to the control circuit 7 are a memory 11 for storing a channel registering table stated below and a clock circuit 10 for measuring the current time.

FIG. 2 shows the channel registering table stored in the memory 11. N-channels including the channel of the same frequency can be registered on the table. A column for writing a frequency and a column for writing a register time are provided for each channel.

Figure 3:
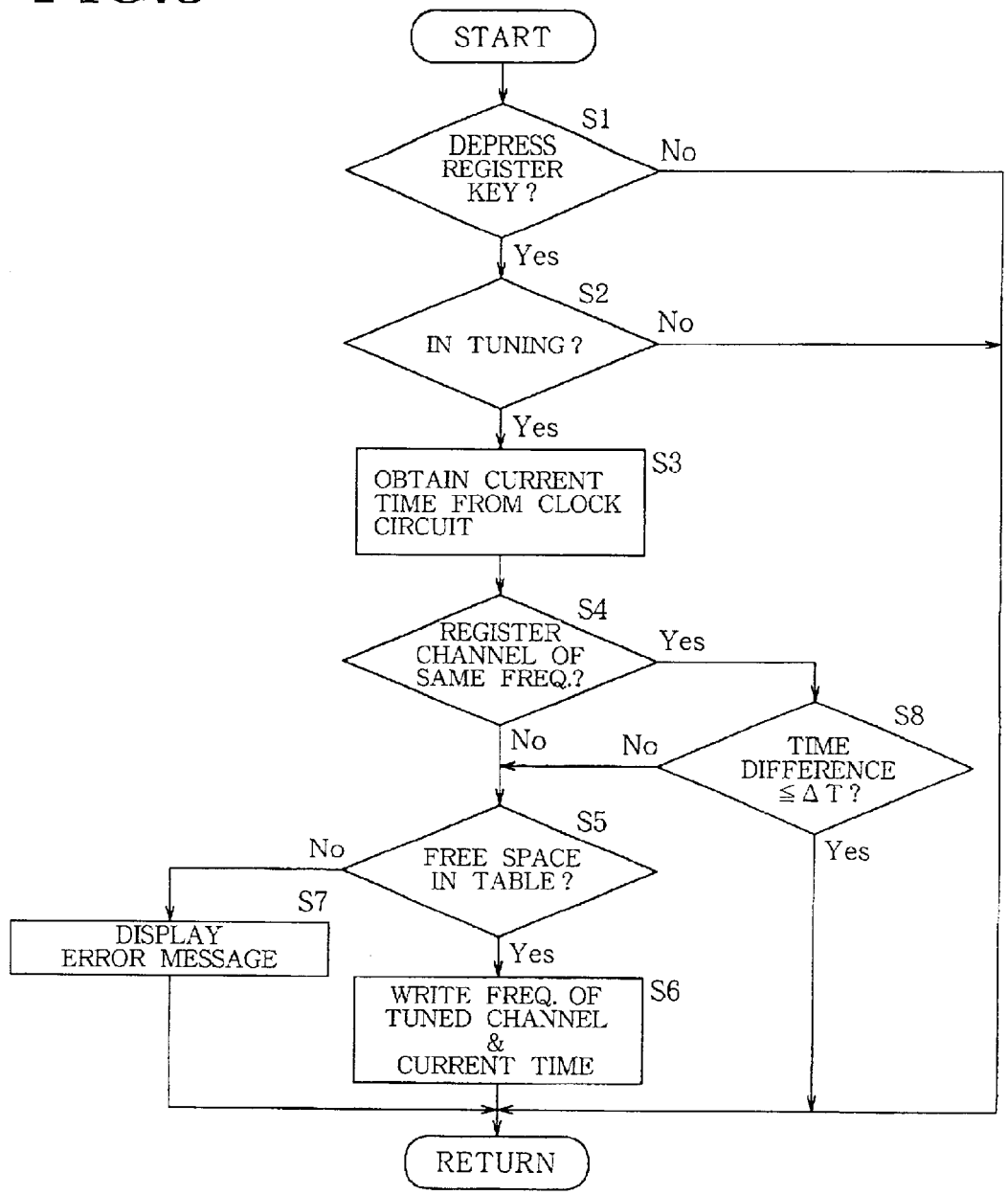
FIG. 3 is a flow chart showing the channel registering procedure executed by the control circuit of the invention.

FIG. 3 shows a channel registering procedure executed by the control circuit 7. First in step S1, an inquiry is made whether the channel register key 82 is depressed. If the inquiry is answered in the negative, the same inquiry is repeated in step S1, while when the inquiry is answered in the affirmative, step S2 follows to inquire whether one channel is tuned in.

If the answer is negative in step S2, then step S1 follows again. On the other hand, when the answer is affirmative, step S3 follows to obtain the current time from the clock circuit 10, and thereafter in step S4, an inquiry is made whether a channel of which a frequency is same as the channel tuned in is registered in the channel registering table shown in FIG. 2. In the case where a channel of which a frequency is same as the channel tuned in is not registered in the channel registering table, the answer for step S4 is negative, followed by step S5.

On the other hand, in the case where a channel of which a frequency is same as the channel tuned in is registered in the channel registering table, the answer for step S4 is affirmative, and step S8 follows to inquire whether time difference between the current time obtained in step S3 and the register time of the channel having the same frequency is not greater than a predetermined value $\Delta T$. If the answer is affirmative, the step S1 follows again. If the answer is negative, the sequence proceeds to step S5.

Step S5 inquires whether the channel registering table has a region of free space. If the inquiry is answered in the affirmative, step S6 follows to write a frequency of the channel tuned in onto the column for writing a frequency and to write the current time obtained in step S3 onto the column for writing register time on the channel registering table, and then the sequence returns to step S1. On the other hand, if the answer for step S5 is negative, an error message, for example, "MEMORY FULL" is shown on the information display device 9, and then the sequence returns to step S1.

According to the procedure described, in the case where a channel of which a frequency is same as the channel tuned in is not registered on the channel registering table, the channel register key 82 is depressed with one channel tuned in, writing the frequency of the channel tuned in onto the column for writing a frequency, and writing the time when the channel register key 82 is depressed onto the column for writing a register time. On the other hand, in the case where a channel of which a frequency is same as the channel tuned in is registered on the channel registering table, only when time difference between the time when the channel register key 82 is depressed and the register time of the channel having the same frequency is greater than the predetermined value $\Delta T$, the frequency of the channel tuned in is written onto the column for writing a frequency and the time when the channel register key 82 is depressed is written onto the column for writing a register time. Thus, the channel tuned in is registered on the channel registering table.

With the radio receiver described, in the case where the channel of which a frequency is same as the channel tuned in is registered on the channel registering table, only when time difference between the register time of the channel having the same frequency and the time when the S11 channel register key 82 is depressed is greater than the predetermined value $\Delta T$, as stated above, the frequency of the channel tuned in and the time when the key is depressed are registered on the channel registering table. Therefore, channels having the same frequency are not registered for same hours in a day, to use memory region of the channel registering table effectively.

Figure 4:
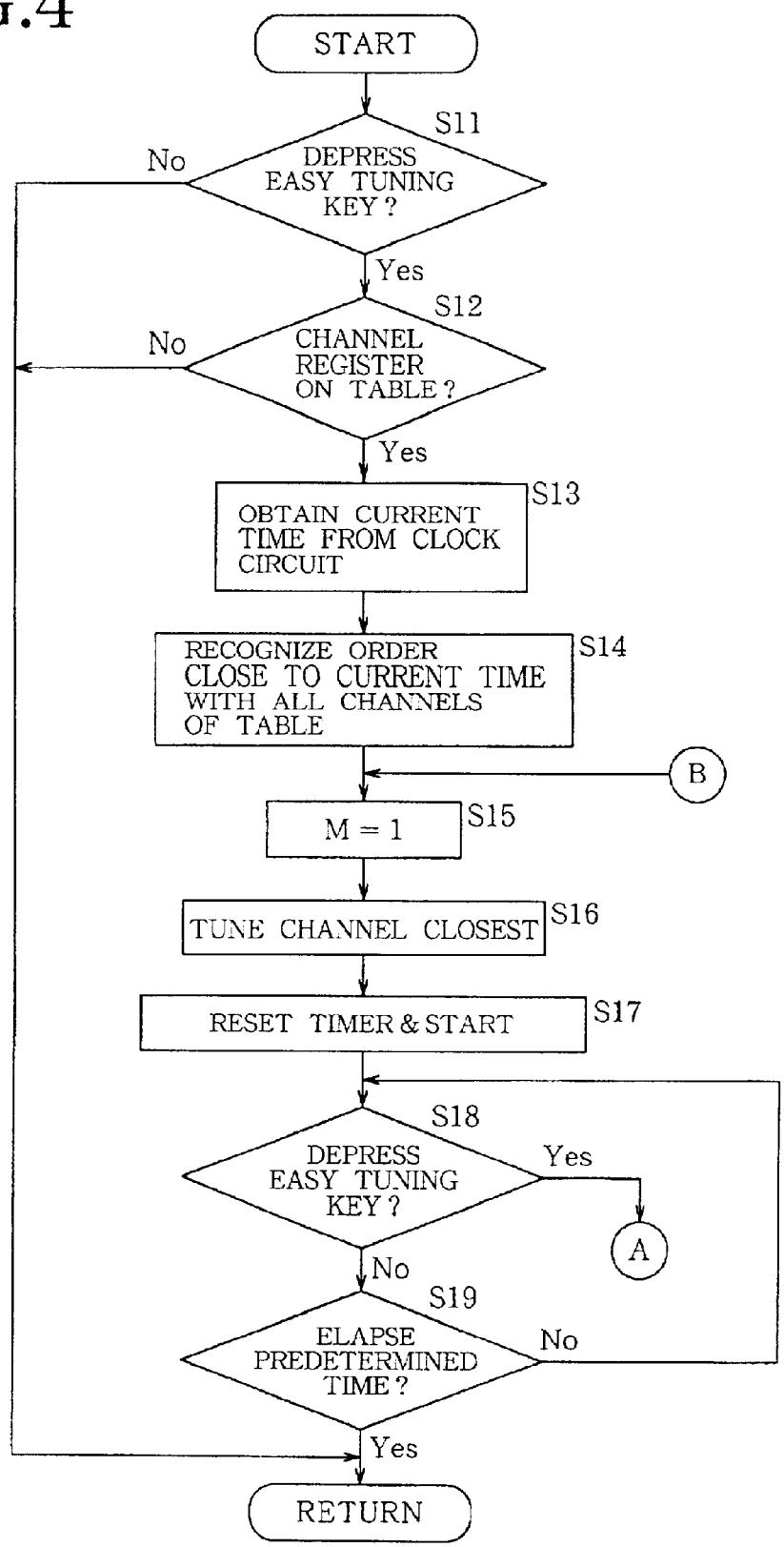
FIG. 4 is a flow chart showing the former half of the tuning command procedure executed by the control circuit described above.
Figure 5:
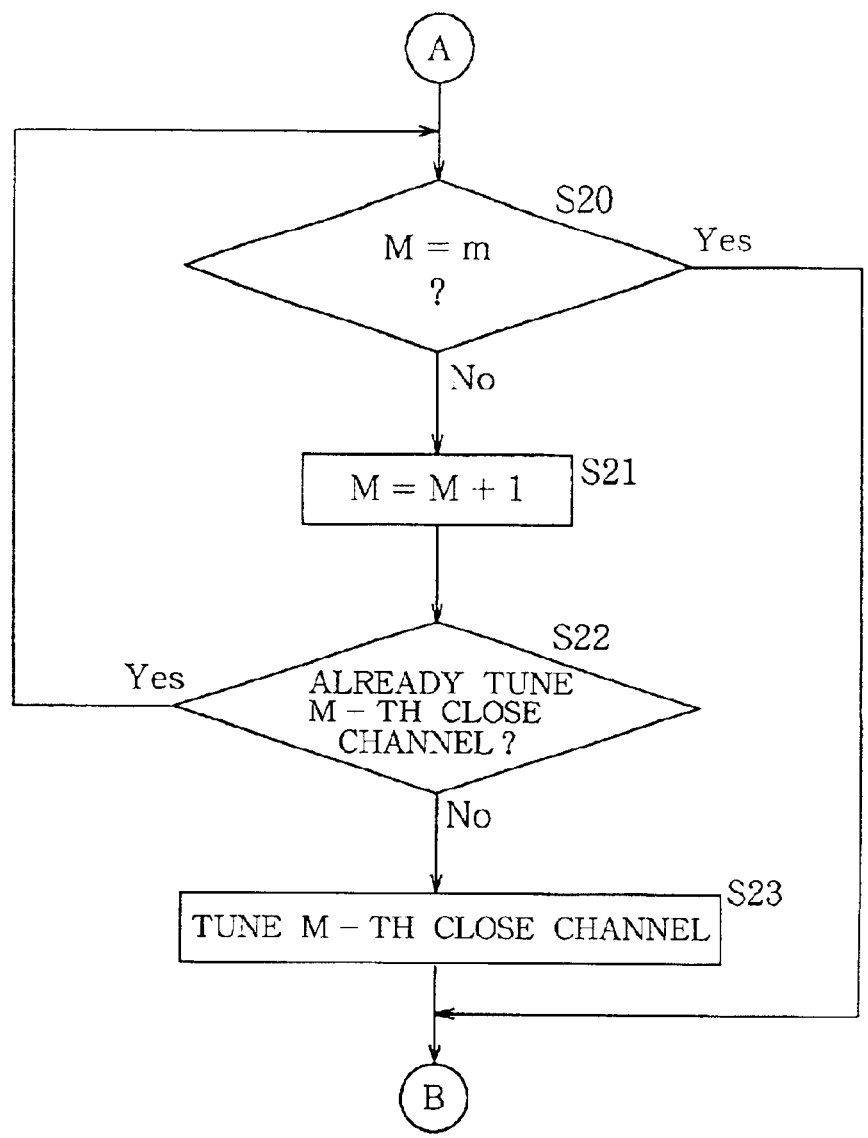
FIG. 5 is a flow chart showing the latter half of the procedure described.

FIGS. 4 and 5 show a tuning command procedure executed by the control circuit 7. First in step S11, an inquiry is made whether the easy tuning key 83 is depressed without the manipulation of the easy tuning key 83 over a predetermined period of time, i.e., whether the first manipulation of the easy tuning key 83 is performed. If the answer is negative, step S11 follows to repeat the same inquiry. If the answer is affirmative, step S12 follows to inquire whether any channel is registered on the channel registering table shown in FIG. 2. When the inquiry is answered in the negative, the sequence returns to step S11. When the inquiry is answered in the affirmative, step S13 follows to obtain the current time from the clock circuit 10, and thereafter step S14 follows to recognize order of the register time being close to the current time obtained in step S13 with all channels registered in the channel registering table. In this step, register time which is closest to the current time comes first in order.

Subsequently in step S15, a counter variable M is initialized. Step S16 thereafter follows to specify a channel recognized as first in order in step S14 out of a plurality of channels registered in the channel registering table, and to command the tuning operation of the channel to the front-end circuit 2. As a result, the channel tune in is a channel of which register time is closest to the time when the easy tuning key 83 is depressed for the first time (hereinafter referred to as the "time of the first key manipulation"), as described above, out of a plurality of channels registered in the channel registering table.

Subsequently in step S17, a timer incorporated therein is reset to start timer operation. Step S18 inquires whether the easy tuning key 83 is depressed again, i.e., whether the second and later manipulation of the easy tuning key is performed. If the inquiry is answered in the negative, step S19 follows to inquire whether a predetermined period of time has elapsed since the timer operation was started. If the answer is negative, step S18 follows again, while if the answer is affirmative, the sequence returns to step S11.

In the case where the easy tuning key 83 is depressed within the predetermined period of time after the start of the timer operation in step S17, the answer for step S18 is affirmative to proceed to step S20 shown in FIG. 5, inquiring whether a counter variable M is equal to m of the number of the channels registered in the channel registering table.

If the answer is negative in step S20, step S21 follows to advance the counter variable M by 1. Then step S22 follows to specify a channel of M-th in the order recognized in step S14 out of a plurality of channels registered in the channel registering table and to inquire whether the channel registering table registers a channel of which frequency is same as the specified channel and of which register time is closer to the time of the first key manipulation than the specified channel, i.e., whether a channel of which frequency is same as the specified channel has already been tuned in. If the inquiry is answered in the affirmative, step S20 follows again, while if the inquiry is answered in the negative, step S23 follows to command tuning operation of the M-th channel to the front-end circuit 2. As a result, the channel of which register time is M-th close to the time of the first key manipulation is tuned in out of the plurality of channels registered in the channel registering table.

Accordingly, a received channel is changed-over in order of register time being close to the first key manipulation with the plurality of channels registered in the channel registering table. When the counter variable M, thereafter, advances to m of the number of the channels registered in the channel registering table, the inquiry is answered in the affirmative in step S20. Then the sequence returns to step S15 shown in FIG. 4 to tune in to a channel of which register time is closest to the time of the first key manipulation again.

According to the procedure described, the easy tuning key 83 is depressed after the predetermined period of time has elapsed since the easy tuning key 83 was last depressed, to tune in to a channel of which register time is closest to the time when the key is depressed out of the plurality of channels registered in the channel registering table.

The easy tuning key 83, thereafter, is depressed again within the predetermined period of time after the depression of the easy tuning key 83, to tune in to a channel of which register time is second closest to the time of the first key manipulation. Furthermore, the easy tuning key 83 is depressed within the predetermined period of time to tune into a channel of which register time is third closest to the time of the first key manipulation. Thus, every time the easy tuning key 83 is depressed within the predetermined period of time, the received channel is changed over in order of register time being close to the time of the first key manipulation with the plurality of the channels registered in the channel registering table. In this step, in the case where the channel registering table registers a plurality of channels of the same frequency, a channel of which frequency is same as a channel which is tuned in once is skipped.

For example, in the case where the channel registering table shown in FIG. 2 is stored in the memory 11, the easy tuning key 83 is depressed at 12:30 to tune in to the channel of frequency, 85.1 MHz (a channel registered on the second row from the top of the table). The easy tuning key 83, thereafter, is depressed again within the predetermined period of time, to change-over the received channel to the channel of frequency, 77.1 MHz (a channel registered on the fifth row from the top of the table). The easy tuning key 83 is depressed again within the predetermined period of time, to change-over the received channel to the channel of frequency, 86.4 MHz (a channel registered on the sixth row from the top of the table). In this step, while a channel of which register time is third closest to the time of the first key manipulation, i.e., 12:30, is the channel registered on the fourth row from the top of the table, the frequency of the channel is, however, 85.1 MHz, and the channel (the channel registered on the second row from the top of the table) of which frequency is same as the channel on the fourth row is already tuned in, so that the channel is skipped.

With the radio receiver of the present invention, only the easy tuning key 83 is provided on the device body serving as a manipulation key capable of tuning in to one channel out of the plurality of channels pre-registered, so that the device body is made compact.

The easy tuning key 83 is once depressed, tuning in to a channel registered at the time which is closest to the time when the key is depressed out of the plurality of channels pre-registered. The listener will listen to a program of the same channel during the same hours in a day. Therefore, the easy tuning key 83 is depressed as described above, tuning in to the channel to which the listener will desire to listen at that time. Accordingly, since the desired channel is automatically tuned in, even if the listener does not remember a channel pre-registered, the desired channel can be tuned in with easy manipulation for a short period of time.

With the radio receiver described, every time the easy tuning key 83 is depressed, the received channel is changed over in order of register time being close to the time of the first key manipulation with the plurality of channels registered in the channel registering table. In this step, a channel of which frequency is same as the channel once tuned in is skipped, so that channels of the same frequency will never be tuned in not less than two times. Even when a channel tuned in corresponding to the first manipulation of the easy tuning key 83 is not a desired channel, the register time of the desired channel is close to the time of the key manipulation. Accordingly, even if a channel tuned in upon the first depression of the easy tuning key is not a desired channel, the desired channel can be tuned in with less times of the manipulation for a short period of time.

The embodiment described above is intended to illustrate the present invention and should not be construed as limiting the invention set forth in the appended claims or reducing the scope thereof. Furthermore, the device of the invention is not limited to the embodiment in construction but can of course be modified variously without departing from the scope of the invention as set forth in the claims.

For example, it is possible to use the construction wherein when the channel registering table has no region of free space upon the depression of the channel register key 82, an error message is displayed and any channel of N channels registered in the channel registering table is erased to register a channel tuned in.

Further, it is also possible to use the construction wherein when a channel tuned in is registered in the channel registering table, in the case where time difference between the time of the depression of the channel register key 82 and the register time of the channel tuned in is greater than a predetermined value ΔT, the register time is updated to the time of the depression.

The invention also can be used with a radio receiver which receives broadcast signals on which time information for indicating the current time is superposed. With the radio receiver, it is possible to use the construction wherein when the channel register key 82 is depressed, the time indicated by the time information superposed on the broadcast signal received at this time is written as a register time onto the channel registering table, and when the easy tuning key 83 is depressed, in order of register time being close to the time indicated by the time information superposed on the broadcast signal received at this time with a plurality of channel registered in the channel registering table. In this case the clock circuit 10 can be omitted.

Further, it is also possible to use the construction wherein one manipulation key is disposed thereon instead of the channel register key 82 and the easy tuning key 83, when the manipulation key is depressed for a shorter period of time than the predetermined period of time, a channel tuned in is registered in the channel registering table, while every time the key is depressed for a longer period of time than the predetermined period of time, a received channel is changed over in order of register time being close to the time of the first key manipulation with a plurality of channels registered in the table. In this case the device body can be made more compact.

What is claimed is:

1. A radio receiver comprising:
channel memory means for pre-registering a plurality of desired channels,
a channel register key for performing manipulation of registering a desired channel in the channel memory means,
time detection means for detecting current time,
information processing means for registering in the channel memory means a frequency of a channel in tuned and registering time detected by the time detection means as register time upon the channel register key being manipulated, when the channel register key is manipulated with the channel tuned in,
easy tuning key for performing manipulation of tuning in to a desired channel, and
tuning control means for comparing time of easy tuning key manipulation detected by the time detection means immediately when the key is manipulated with register time of each channel registered in the channel memory means, and specifying a channel of which register time is closest to the time of the key manipulation out of one or a plurality of channels registered in the channel memory means, and commanding tuning operation of the channel.

2. A radio receiver according to claim 1 wherein the information processing means comprises:
register checking means for checking whether when the channel register key is manipulated with a channel tuned in, a channel of which a frequency is same as a frequency of the channel tuned in is registered in the channel memory means,
first register processing means for registering in the channel memory means a frequency of the channel tuned in and registering in the channel memory means time as register time detected by the time detection means upon the channel register key being manipulated, in the case where a channel of which a frequency is same as a frequency of the channel tuned in is not registered in the channel memory means,
time difference checking means for comparing the register time of the channel of the same frequency with time detected by the time detection means upon the channel register key being manipulated, and checking whether time difference between the register time and the time detected is not greater than a predetermined value, in the case where a channel of which a frequency is same as a frequency of the channel tuned in is registered in the channel memory means, and
second register processing means for registering in the channel memory means the frequency of the channel tuned in and registering in the channel memory means the time as register time detected by the time detection means upon the channel register key being manipulated, in the case where the time difference between the register time and the time detected is greater than the predetermined value.

3. A radio receiver according to claim 2 wherein the information processing means further comprises information update means for updating the register time of the channel of which a frequency is same as a frequency of the channel tuned in to the time detected by the time detection means upon the channel registering key being manipulated, in the case where the time difference between the two times stated above is not greater than the predetermined value according to the time difference checking means.

4. A radio receiver according to claim 1 wherein the tuning control means comprises:
order recognition means for recognizing order of the register time being close to time of the first manipulation of the easy tuning key with a plurality of channels registered in the channel memory means corresponding to the first manipulation of the key,
tuning command means for specifying a channel of which register time is closest to the time of the first key manipulation out of a plurality of channels registered in the channel memory means based on the order recognized by the order recognition means corresponding to the first manipulation of the easy tuning key, and commanding tuning operation of the channel, and channel change-over control means for specifying a channel of which register time is closest in the next place of the channel tuned in to the time of the first key manipulation out of a plurality of channels registered in the channel memory means based on the order recognized by the order recognition means corresponding to the second and later manipulation of the easy tuning key.

5. A radio receiver according to claim 4 wherein the channel change-over control means comprises:

channel specifying means for specifying a channel of which register time is closest in the next place of the channel tuned in to the time of the first key manipulation out of the plurality of channels registered in the channel memory means corresponding to the second and later manipulation of the easy tuning key, or to channel specifying command based on the order recognized by the order recognition means, checking means for checking whether a channel is registered in the channel memory means, which has a same frequency as the specified channel and of which register time is closer to the time of the first key manipulation than the specified channel, change-over command means for commanding tuning change-over operation for changing-over a received channel to the specified channel, in the case where the channel is not registered, and channel specifying command means for giving channel specifying command to the channel specifying means, in the case where the channel is registered.

* * * * *